(12) United States Patent
Lexa

(10) Patent No.: US 10,892,533 B2
(45) Date of Patent: Jan. 12, 2021

(54) POWER SENSOR STANDARD

(71) Applicant: Tegam, Inc., Geneva, OH (US)

(72) Inventor: Jefferson D. Lexa, Jackson, OH (US)

( * ) Notice: Subject to any disclaimer, the term of this patent is extended or adjusted under 35 U.S.C. 154(b) by 183 days.

(21) Appl. No.: 16/058,153

(22) Filed: Aug. 8, 2018

(65) Prior Publication Data

US 2020/0052358 A1 Feb. 13, 2020

(51) Int. Cl.
*G01R 21/00* (2006.01)
*H01P 1/26* (2006.01)
*H01P 3/123* (2006.01)

(52) U.S. Cl.
CPC .............. *H01P 1/264* (2013.01); *G01R 21/00* (2013.01); *H01P 3/123* (2013.01)

(58) Field of Classification Search
CPC .......... H01P 1/264; H01P 3/123; G01R 21/00
See application file for complete search history.

(56) References Cited

U.S. PATENT DOCUMENTS

| 4,871,964 | A  | * | 10/1989 | Boll | G01R 1/07342 |
|---|---|---|---|---|---|
|  |  |  |  |  | 324/750.22 |
| 8,653,828 | B2 | * | 2/2014 | Hancock | A61B 18/18 |
|  |  |  |  |  | 324/601 |
| 2002/0041232 | A1 | * | 4/2002 | Harman | H01Q 13/203 |
|  |  |  |  |  | 340/541 |
| 2006/0214835 | A1 | * | 9/2006 | Lee | G01N 22/00 |
|  |  |  |  |  | 342/22 |
| 2010/0121318 | A1 | * | 5/2010 | Hancock | A61N 5/02 |
|  |  |  |  |  | 606/33 |

* cited by examiner

*Primary Examiner* — Christopher P McAndrew
*Assistant Examiner* — Zannatul Ferdous
(74) *Attorney, Agent, or Firm* — Brennan, Manna & Diamond, LLC

(57) ABSTRACT

A power sensor system, assembly and method for use as a power sensor standard in the 50 to 75 GHz frequency range. The power sensing system comprises a housing comprising a dual ridged waveguide impedance transformer, and a resistive component attachable to a back side of the housing. The resistive component comprises a terminating element electrically, but not thermally isolated from a sensing element. The sensing element operates at a constant resistance and is perpendicularly oriented to the terminating element.

15 Claims, 8 Drawing Sheets

POWER SENSOR STANDARD

COPYRIGHT NOTICE

A portion of the disclosure of this non-provisional patent application contains material which is subject to copyright protection. The patent owner has no objection to facsimile reproduction by anyone of the patent document or patent disclosure, as it appears in the Patent and Trademark Office patent file or records, but otherwise reserves all copyright rights whatsoever.

BACKGROUND

Waveguide power transfer standards enable the measurement of radio frequency (RE), microwave, and millimeter power for varying frequency ranges. A waveguide structure guides electromagnetic waves by limiting expansion of the transverse waves perpendicular to the axis of propagation. A sensor is then employed within the waveguide structure to either absorb or detect the guided incident electromagnetic energy and provide a means with which to measure and determine power. Sensors commonly used have typically been bead sensing devices or fm-line type of transforming circuits. Unfortunately these types of sensors result in lower power measurement uncertainty capability. Additionally, the calibration efficiency factor is significantly limited by thermal leakage of the input power to the waveguide housing upon which the sensor is attached.

Low frequency sensors typically use an actual change in temperature or in resistance as the sensed property. However, operating at a constant temperature or resistance is superior as linearity is substantially improved. This will also significantly decrease uncertainty in power measurements and improve calibration efficiency. In addition, standard waveguide configurations normally used in the millimeter frequency range provide fundamentally narrower bandwidth capability as compared to other waveguide topologies such as dual ridged waveguide. An additional issue with AC- or DC-substitution sensors made using thermistor "beads" such as are used in HP486A, 8486B, and Weinschel/TEGAM 1110 through 2510 is that the beads are made on fine (approximately 0.0007" diameter) wires. While such wires provide high sensitivity, they also result in a step change in wave line width that causes a reflective discontinuity. Existing waveguide thermistor sensors such as Hughes/Militech exhibit this problem in high VSWR performance. The present invention is able to provide a smooth, wideband match with improved reflection over the thermistor design without sacrificing the linearity of substitution designs.

Accordingly, there is a long felt need in the art for a WR-15 standard interface waveguide sensor that measures power in the 50 to 75 GHz frequency range (V-band) or other frequency bands when scaled appropriately. Specifically, a device that can be used as a power standard due to lower power measurement uncertainty capability is needed. Additionally, a device is needed that can separate a termination resistance from a sense resistance while coupling the termination structure to a waveguide so that the resistive structure works thermally while providing high frequency match.

SUMMARY

The following presents a simplified summary in order to provide a basic understanding of some novel embodiments described herein. This summary is not an extensive overview, and it is not intended to identify key/critical elements or to delineate the scope thereof. Its sole purpose is to present some concepts in a simplified form as a prelude to the more detailed description that is presented later.

A power sensing assembly comprising a housing and a resistive component. The housing comprises a standard waveguide interface and a dual ridged waveguide impedance transformer that runs through the housing from a front side through a back side. The dual ridged waveguide impedance transformer topology is configured to concentrate high frequency power as well as transform the waveguide impedance as it travels through the assembly. As such, the dual ridged waveguide impedance transformer may comprise a plurality of specifically proportioned heights and lengths of steps or ridges narrowing an axial separation distance between corresponding ridges within the waveguide from the front side through the back side. Other embodiments of the impedance transformer may comprise a plurality of tapered slopes with specifically designed contours to meet desired frequency responses within the waveguide bandwidth and may be employed equally well in either rectangular or circular waveguides.

The resistive component is attached to the back side of the housing and aligned with both ridges of the waveguide. The resistive component comprises a substrate, a terminating element, and a sensing element. The sensing element is separated from the terminating element by the substrate, and is substantially perpendicularly oriented to the terminating element. The sensing element is thermally, but not electrically coupled to the terminating element.

The power sensing assembly may further comprise a mounting plate, a backside short and a backside short shim. The backside short shim is configured to optimize a distance from a plane of a resistive termination to the backside short inside the waveguide. The mounting plate comprises an opening for accepting the resistive component and a plurality of attachments for connection of the resistive component to external bias circuitry for further processing.

Further, a method of measuring power comprises providing a power sensing assembly comprising a dual ridged waveguide impedance transformer, a terminating element, and a sensing element. The terminating element and the sensing element are aligned with the dual ridged waveguide transformer to achieve good match characteristics. The terminating element is electrically, but not thermally isolated from the sensing element. Tuning capability is also provided if necessary to achieve an optimal matched termination for specific frequency ranges within the fundamental waveguide bandwidth that is independent from the sensing element.

To the accomplishment of the foregoing and related ends, certain illustrative aspects are described herein in connection with the following description and the annexed drawings. These aspects are indicative of the various ways in which the principles disclosed herein can be practiced and all aspects and equivalents thereof are intended to be within the scope of the claimed subject matter. Other advantages and novel features will become apparent from the following detailed description when considered in conjunction with the drawings.

DETAILED DESCRIPTION

Figure 1:
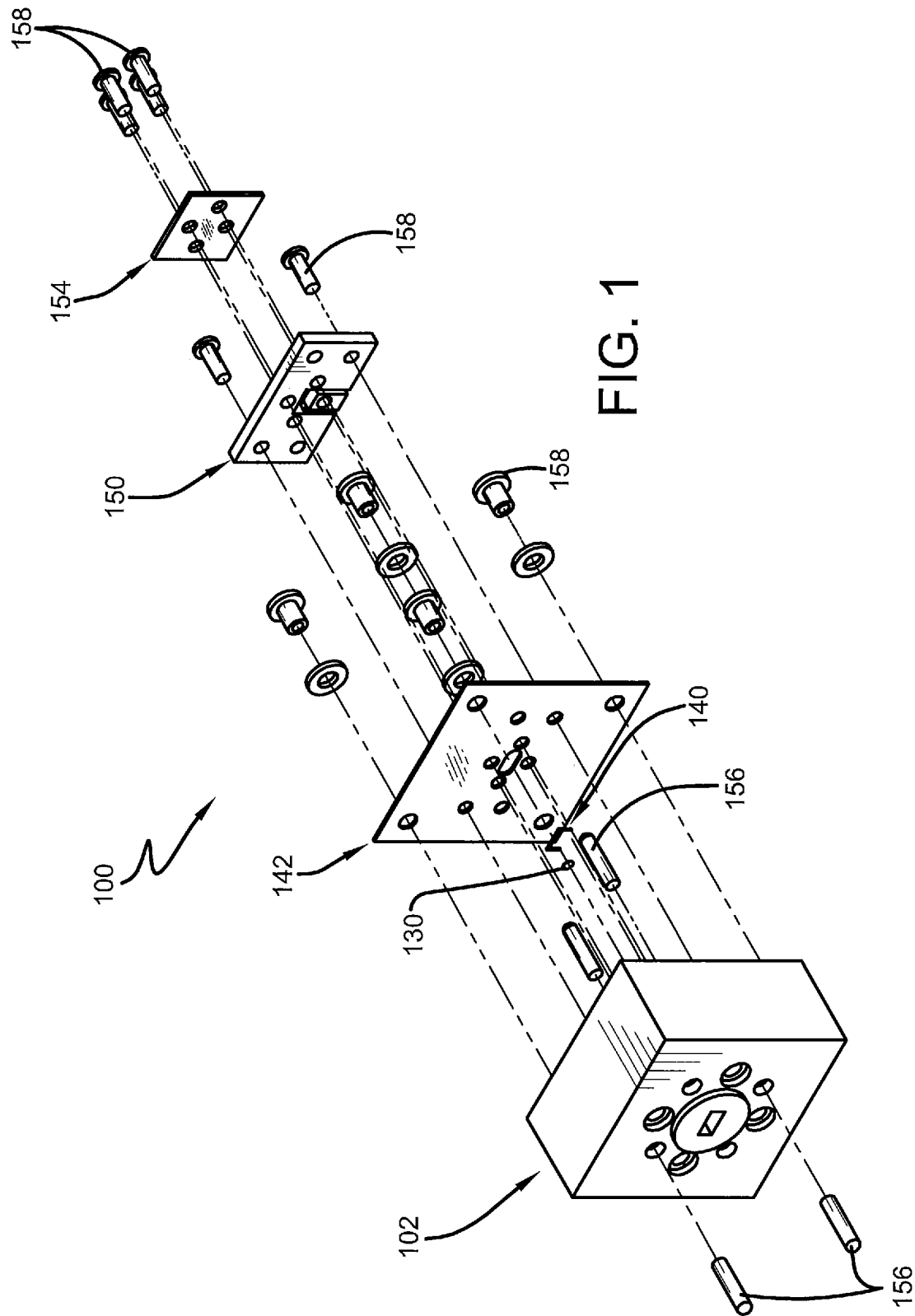
FIG. 1 illustrates an exploded perspective view of a power sensing assembly in accordance with the disclosed architecture.
Figure 2:
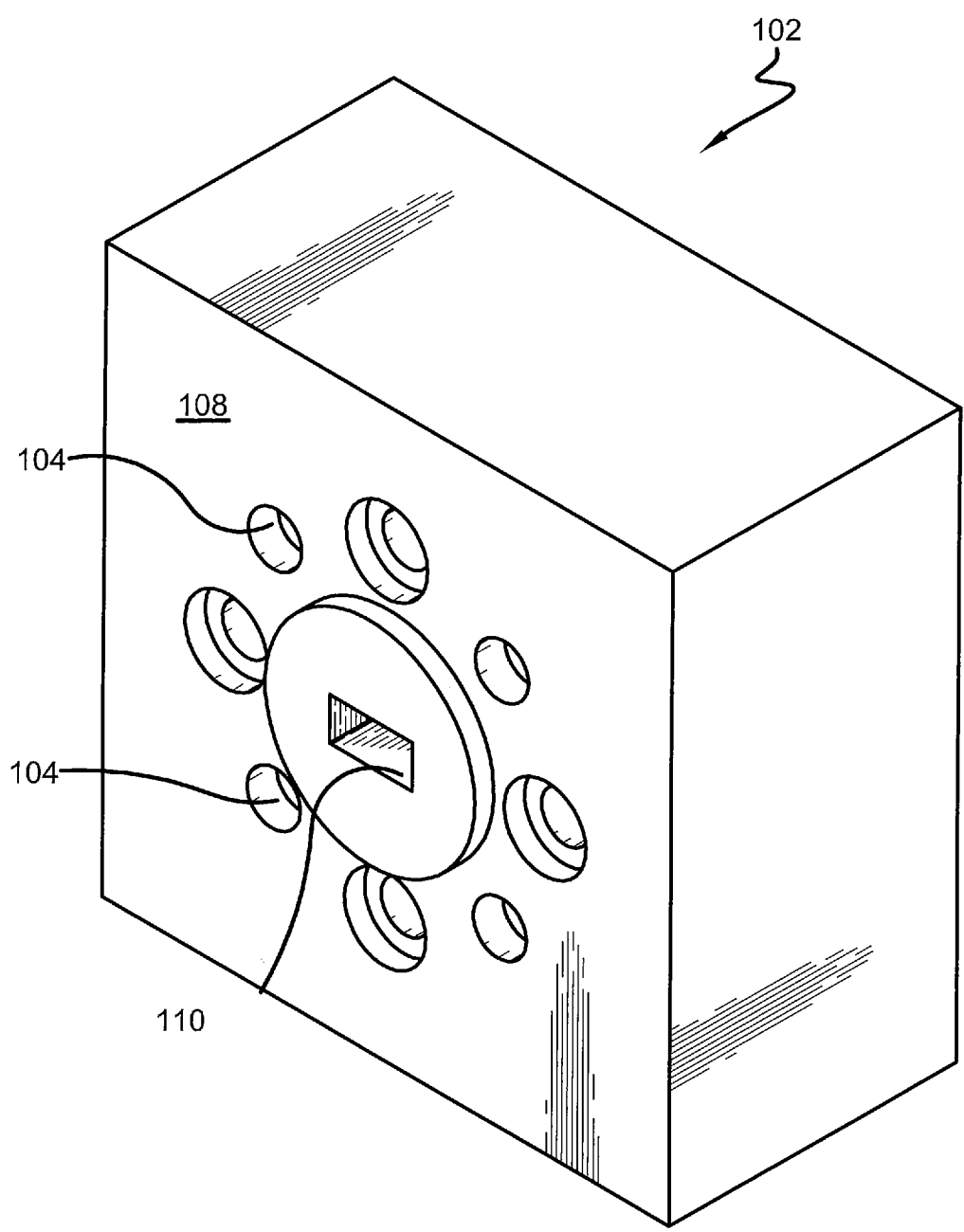
FIG. 2 illustrates a front perspective view of a housing of the power sensing assembly in accordance with the disclosed architecture.
Figure 3:
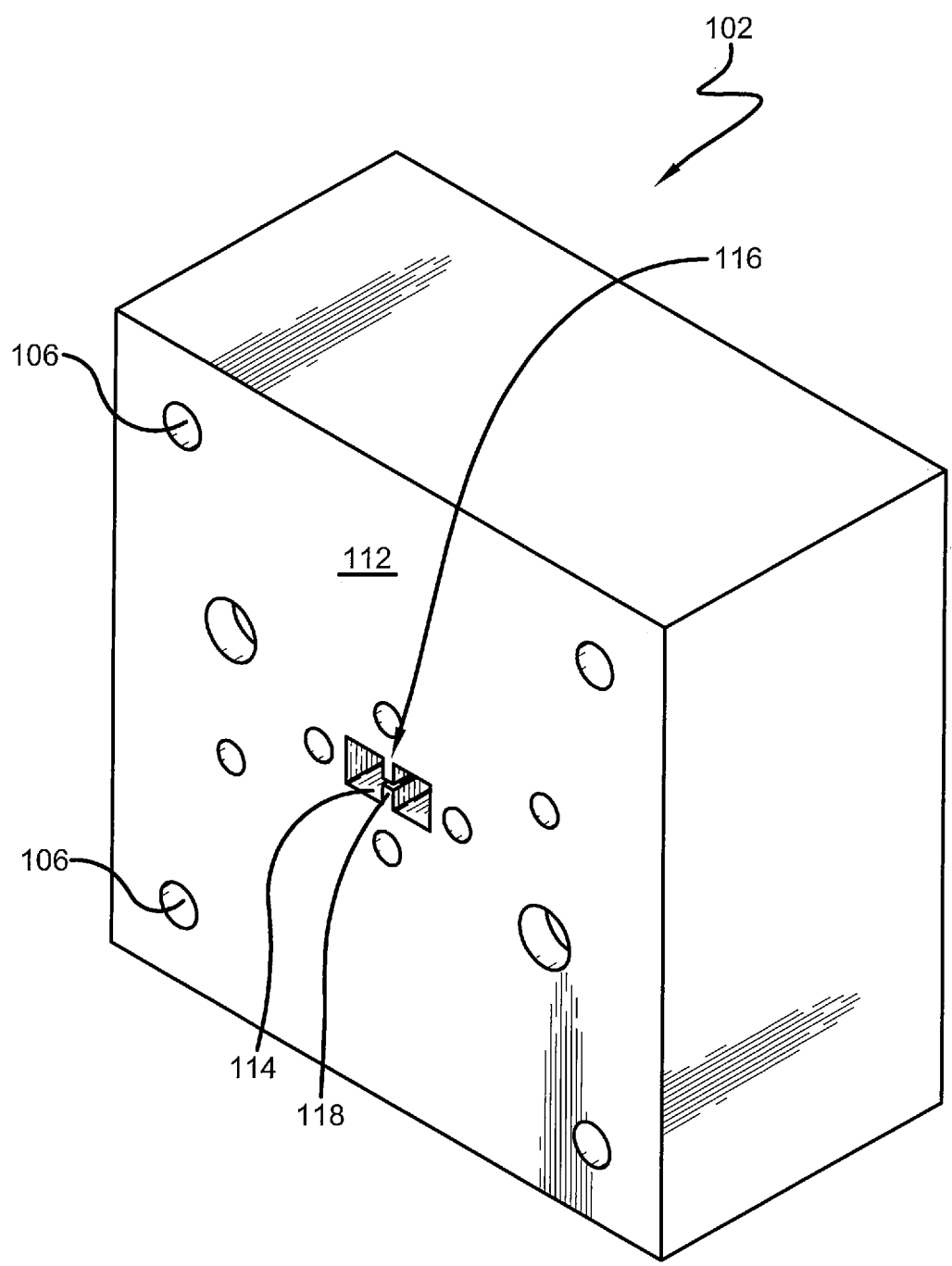
FIG. 3 illustrates a back perspective view of the housing of the power sensing assembly in accordance with the disclosed architecture.

Conventional waveguide sensors suffer from poor reflection performance and high power measurement uncertainty. The present invention is useful as a power measurement standard for V band (50-75 GHz) or other frequency bands, such as to at least 110 GHz (WR-10) for example, when scaled appropriately. Additionally, larger embodiments will provide good results at lower frequencies as well. The power sensing assembly provides a lower uncertainty method for measuring microwave power. The power sensing assembly is configured to allow connection to a standard WR-15 waveguide interface. The reflection performance is substantially improved over both existing bead sensing devices or fin-line type transforming circuits resulting in significantly lower power measurement uncertainty capability. The calibration efficiency factor of the present invention is in the range of approximately between 55-60 percent limited by thermal leakage of the input power to the waveguide housing upon which the microwave circuit is attached. However, the variation of the efficiency factor within the frequency band is less than existing approaches.

Reference is now made to the drawings, wherein like reference numerals are used to refer to like elements throughout. In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives falling within the spirit and scope of the claimed subject matter. The invention relates generally to a power sensing assembly and method of measuring power.

FIG. 1 illustrates a power sensing assembly 100. The power sensing assembly 100 comprises a housing 102 and a resistive component 130. The power sensing assembly 100 further comprises a mounting plate 142, a backside short shim 150, and a backside short 154.

Figure 8:
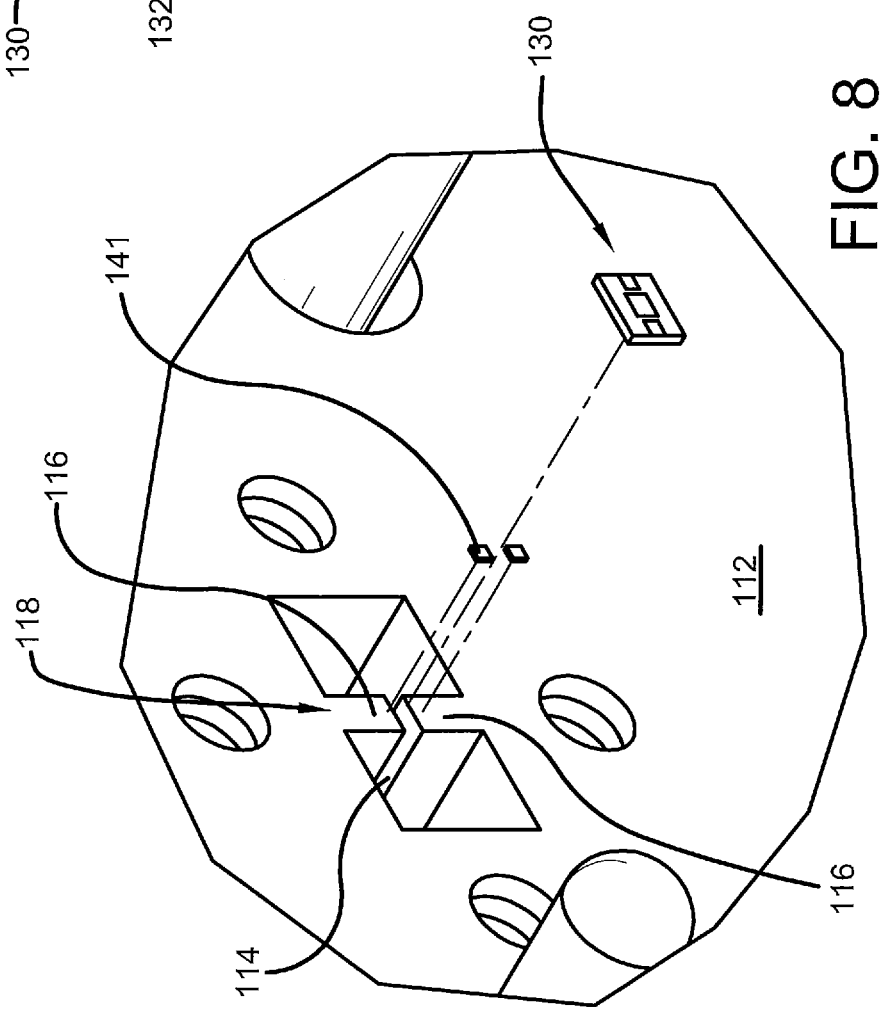
FIG. 8 illustrates an exploded close up internal view of the dual ridged waveguide output port in the housing and a resistive component of the power sensing assembly in accordance with the disclosed architecture.
Figure 11:
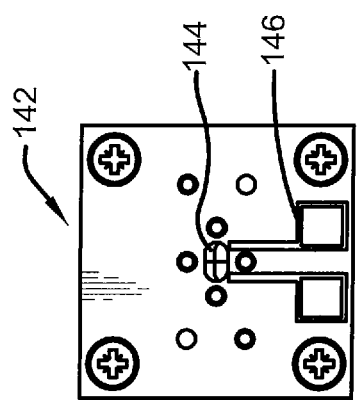
FIG. 11 illustrates a back view of the mounting plate in accordance with the disclosed architecture.

As illustrated in FIGS. 1-5, the housing 102 is typically manufactured from a base material such as, but not limited to, copper, beryllium copper, nickel, aluminum, or similar metal or alloy. In addition, thin plated highly conductive coatings such as silver, copper, gold or other similar alloys may be added to enhance the conductivity of the base metal. Composite type coatings consisting of dielectric/metallic plating may also be employed to protect against corrosion. The housing 102 comprises a front side 108, a back side 112, and a dual ridged waveguide impedance transformer 120. The front side 108 comprises a standard waveguide interface opening 110, and the back side 112 comprises a dual ridged waveguide output 114. The dual ridged waveguide output 114 comprises a midpoint 118 and an attachment position 116 for the resistive component 130. The attachment position 116 is oriented approximately vertically across the dual ridged waveguide output 114. The attachment position 116 may be a pair of ridges (top and bottom) that are substantially identically symmetrical and positioned along the midpoint 118 as illustrated in FIG. 8. The dual ridged waveguide impedance transformer 120 extends through the housing 102 from the standard waveguide interface opening 110 through the dual ridged waveguide output 114.

Figure 6:
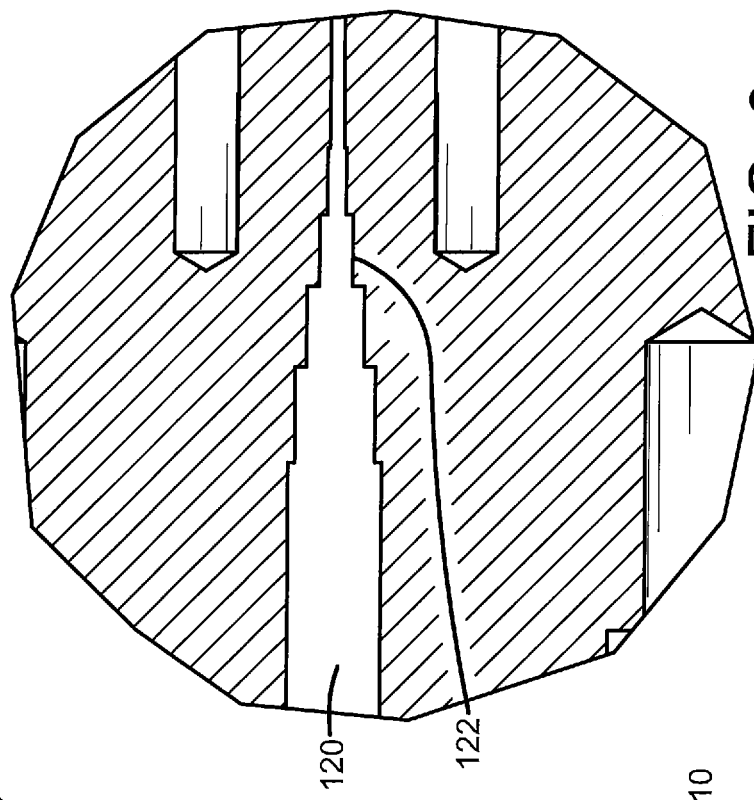
FIG. 6 illustrates a close-up cut away view of detail B of FIG. 5 illustrating a dual ridged waveguide impedance transformer of the power sensing assembly in accordance with the disclosed architecture.
Figure 5:
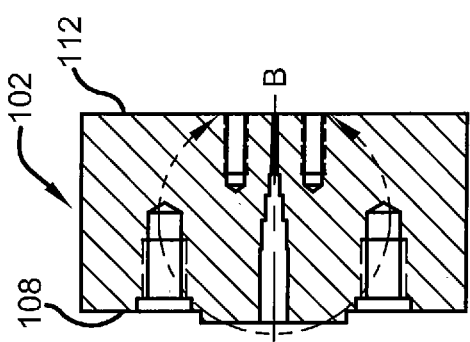
FIG. 5 illustrates a cross-sectional view of the housing along line A-A of FIG. 4 in accordance with the disclosed architecture.
Figure 4:
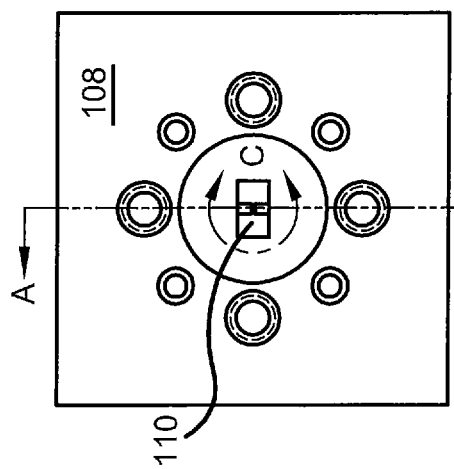
FIG. 4 illustrates a front view of the housing in accordance with the disclosed architecture.
Figure 7:
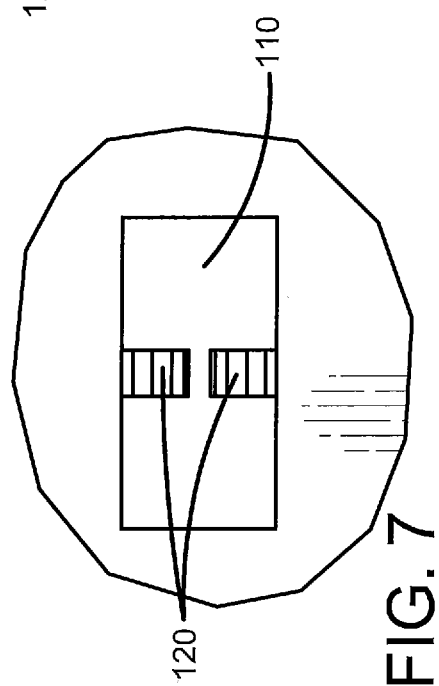
FIG. 7 illustrates a close-up view of detail C of FIG. 4 illustrating the standard waveguide input port interface in the housing in accordance with the disclosed architecture.

In one embodiment, the dual ridged waveguide impedance transformer 120 is substantially rectangular in configuration and may comprise a plurality of steps 122 or ridges designed to narrow the separation distance between opposing ridges of the dual ridge waveguide impedance transformer 120 from the standard waveguide interface opening 110 through the dual ridged waveguide output 114 as shown in FIGS. 5 and 6. As such, the dual ridged waveguide impedance transformer 120 is designed to convert the impedance of a transversely propagated high frequency wave within a standard waveguide interface to the impedance of a small resistive termination located at the dual ridge waveguide output 114. In addition, as high frequency power enters the power sensing assembly 100, the steps 122 or ridges of the dual ridged waveguide transformer topology concentrate the high frequency power substantially perpendicular to an axis of high frequency wave propagation within the dual ridged waveguide impedance transformer 120 and convert the field energy to thermal energy via the closely coupled thermal path to the resistive component 130 where the energy is dissipated. Alternatively, the dual ridged waveguide impedance transformer 120 may be quadrilateral, circular, or any other shape in configuration that produces a good response. Similarly, dual ridged waveguide impedance transformer 120 may comprise stepped, or tapered ridges, or a tapered contour that terminate in a planar resistor and RTD assembly to improve the bandwidth of the match to the termination.

The housing 102 further comprises a plurality of alignment holes 104 and a plurality of attachment holes 106. The power sensing assembly 100 further comprises a plurality of alignment pins 156 for engaging the plurality of alignment holes 104, and a plurality of fasteners 158 for engaging the plurality of alignment holes 104.

Figure 9:
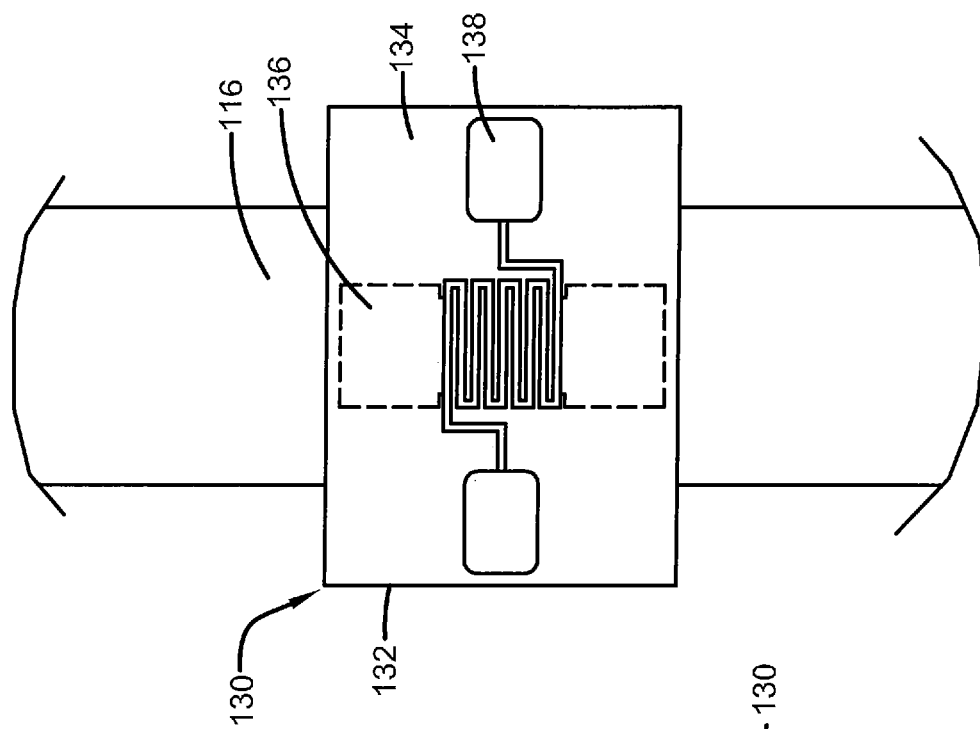
FIG. 9 illustrates a close-up internal view of the resistive component attached to the housing in accordance with the disclosed architecture.

As illustrated in FIGS. 8 and 9, the resistive component 130 in one embodiment is a microwave thin film circuit 132 on a single substrate configured to contain both a terminating and a sensing device attached at the end of a dual ridged waveguide impedance transformer 120. The resistive component 130 comprises a substrate 134, a terminating element 136, and a sensing element 138. The resistive component 130 is aligned with the dual ridged waveguide impedance transformer 120 and is conductively attached electrically to the housing 102 at the attachment position 116 via an attachment element 141 such as, but not limited to, a pair of epoxy pads, or by other such electrically appropriate conductive means. Alternatively, mechanical fastening may be feasible for larger, lower frequency designs where the necessary space would be available. The drawback would be the fasteners would draw thermal energy away from the sensing element, but insulated screws or spring loaded designs could minimize this effect. Additionally, it could be clamped using clamping arrangements not described, or using a solder system. Once attached, the terminating element 136 and the sensing element 138 are essentially suspended at the end of the dual ridged waveguide impedance transformer 120. The terminating element 136 will ideally be located adjacent to the midpoint 118 of a gap between the attachment positions 116 of the dual ridged waveguide output 114. The substrate 134 will similarly be centered on the gap.

The resistive component 130 is essentially a power sensor. The terminating element 136 provides a matched termination for the rigid waveguide topology while simultaneously providing a source of heat energy, the high frequency power dissipated by the terminating element 136, for the sensing element 138. The terminating element 136 is a resistive or other energy absorbing device, such as a matched termination resistor, or any other device that dissipates power from a high frequency source. The sensing element 138 may be any resistive structure with a positive or negative temperature coefficient such as, but not limited to a resistive temperature detector (RTD), a platinum sensor, a thermistor, a metallic RTD, a semiconductor with bulk resistance and a high temperature coefficient such as Germanium, or any structure with a strong temperature coefficient of resistance. The sensing element 138 may also be any other energy detecting device, suitable for sensing the energy from the terminating element 136.

The substrate 134 is typically a dielectric material. The terminating element 136 and the sensing element 138 are oriented substantially perpendicular or 90 degrees to each other. Additionally, the terminating element 136 is located on the one side of the substrate 134 facing the housing 102, and the sensing element 138 is positioned on the opposite side of the substrate 134. This electrically isolates the terminating element 136 from the sensing element 138, yet allows thermal energy to propagate. This separation and perpendicular orientation minimize electromagnetic disturbances to the applied signal to be measured. As such, each energy absorbing and energy detecting function can be optimized largely independent of each other, thereby leading to a much lower reflection capability than previously obtained with other approaches which results in lower power measurement uncertainty capability. While not connected electrically, the terminating element 136 and the sensing element 138 are still thermally coupled allowing the concentrated power to be transferred to the sensing element 138.

The sensing element 138 ideally operates at a constant resistance in a self-balancing system. The power sensing assembly 100 operates as a DC-substitution bolometer using a closed-loop balancer to maintain constant resistance. The sensing element 138 may be integrated with another device (not shown) designed to control power to the sensor to keep the element at a constant resistance. The other device reacts to the change in resistance and uses that to calculate high frequency (RF) power. Therefore, the sensitivity is manifested as the needed change in DC power to keep the sensing element 138 at constant resistance. This is desirable as now a high frequency (RF) termination may match with an adjacent thermally coupled RTD or thermistor in which the change in resistance is the measurand to be converted to power. This is a distinct improvement over other low-frequency sensors that use the actual change in resistance or temperature as the sensed property. Operating at a constant resistance or temperature is superior as linearity is substantially improved. The present invention separates the termination resistance from the sense resistance and uniquely couples the termination structure to a stepped waveguide that allows the resistive structure to be small enough to work thermally while also providing excellent high frequency (RF) match.

The matched termination of the wave may also be tuned independently from the sensing element 138. As illustrated in FIGS. 10-16, the mounting plate 142 may comprise a printed circuit board (PCB) comprising an opening 144 and a plurality of attachments 146. The power sensing assembly 100 further comprises a pair of bond wires 140. The mounting plate 142 is positioned so that the opening 144 is located adjacent to the resistive component 130. The mounting plate 142 is aligned with the housing 102 via the alignment pins 156 and is secured via the fasteners 158. Each of the pair of bond wires 140 is long a thin wire that connects the sensing element 138 to the plurality of attachments 146 of the mounting plate 142. This connection provides high frequency isolation to an external sensing bias circuitry of the PCB. The plurality of attachments 146 are typically PCB pads, connecting wires or the like on an outward facing side of the mounting plate 142. The dimensions of the wires provide a sizable inductive reactance to any high frequency signals that may inadvertently leak onto them in the frequency range of interest, thereby blocking them from ever reaching and possibly corrupting the desired DC bias circuitry used to measure the change in resistance of the sensing element 138.

Figure 13:
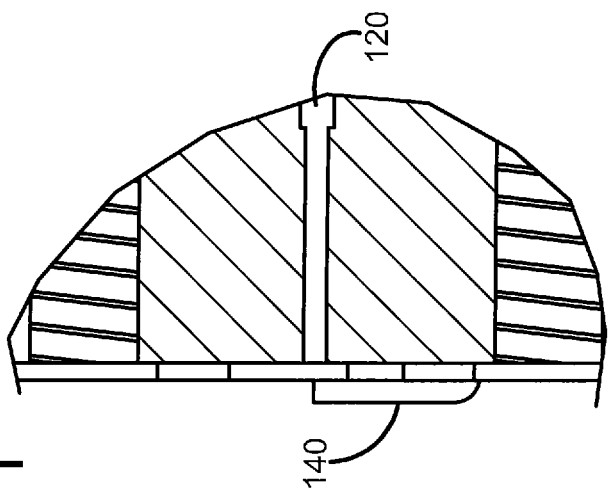
FIG. 13 illustrates a close-up cut away side view of the mounting plate attached to the housing in accordance with the disclosed architecture.
Figure 10:
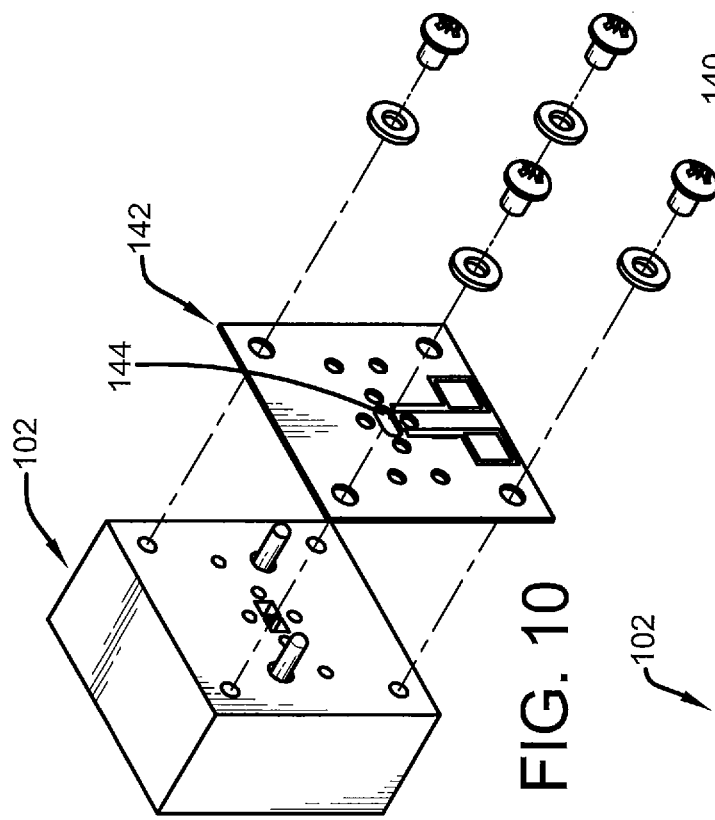
FIG. 10 illustrates an exploded view of the housing and a mounting plate of the power sensing assembly in accordance with the disclosed architecture.
Figure 14:
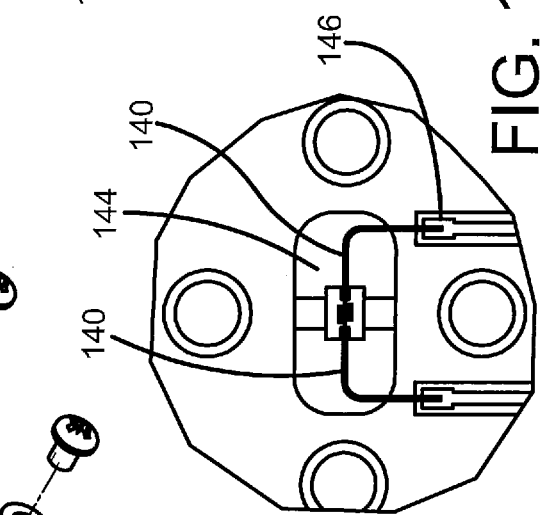
FIG. 14 illustrates a close-up internal view of the resistive component attached to the mounting plate in accordance with the disclosed architecture.
Figure 12:
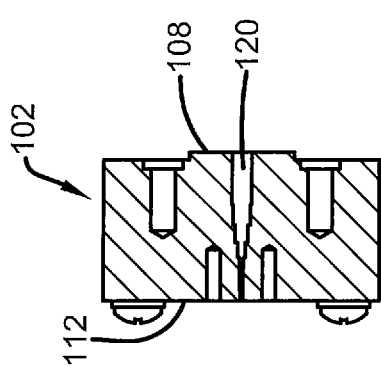
FIG. 12 illustrates a cut away side view of the housing in accordance with the disclosed architecture.
Figure 16:
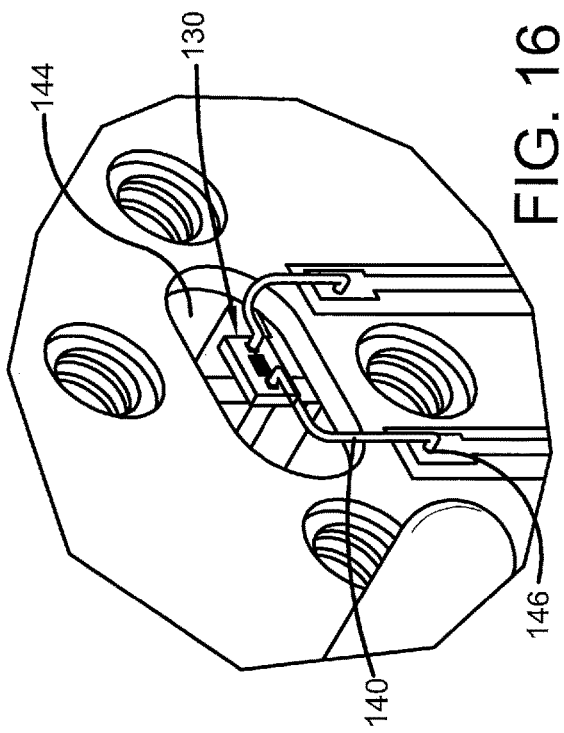
FIG. 16 illustrates a close up internal view of the resistive component in place between the mounting plate and the housing in accordance with the disclosed architecture.
Figure 18:
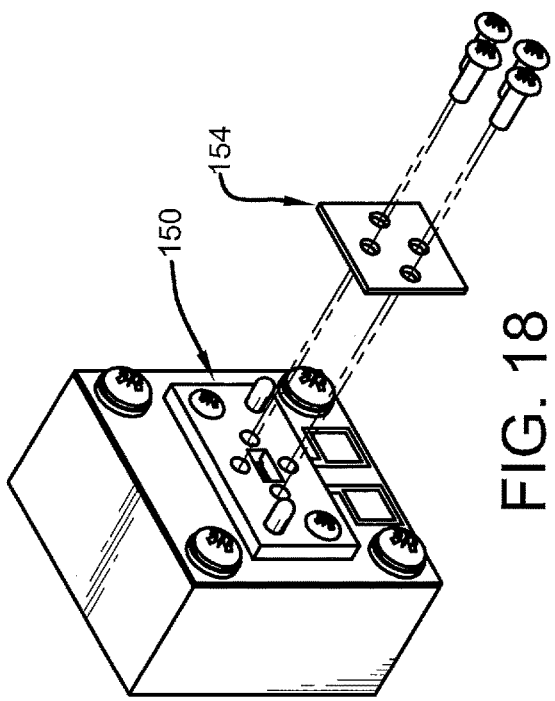
FIG. 18 illustrates an exploded view of the housing, the mounting plate, the backside short shim, and a backside short of the power sensing assembly in accordance with the disclosed architecture.
Figure 15:
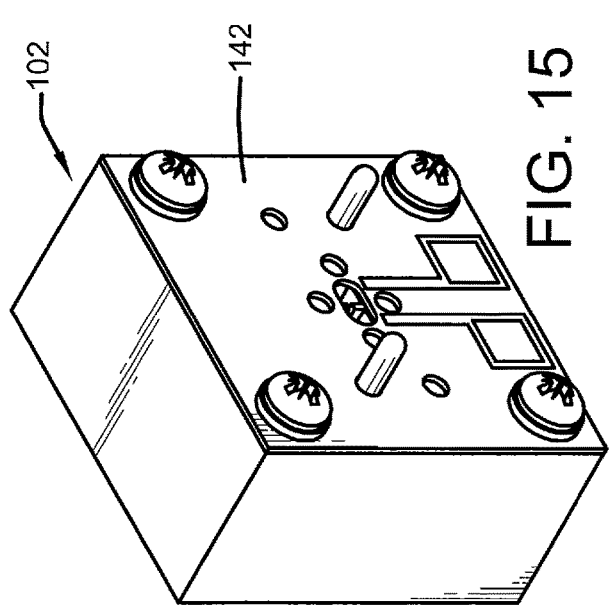
FIG. 15 illustrates a rear perspective view of the mounting plate attached to the housing in accordance with the disclosed architecture.
Figure 17:
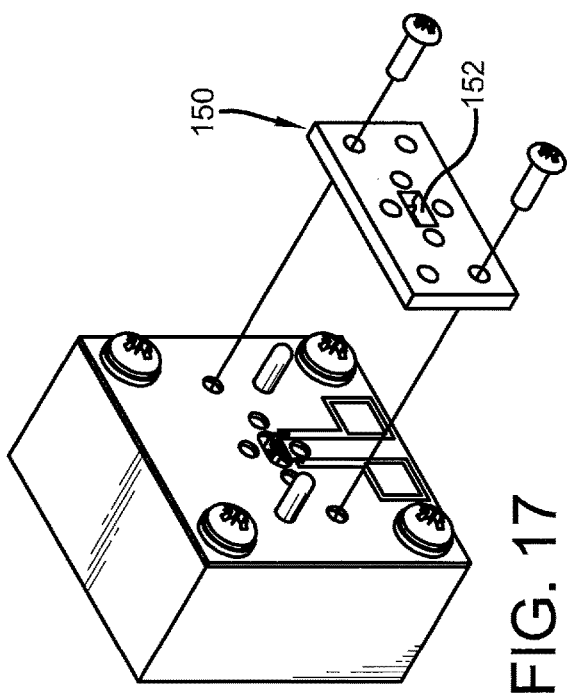
FIG. 17 illustrates an exploded view of the housing, the mounting plate, and a backside short shim of the power sensing assembly in accordance with the disclosed architecture.
Figure 19:
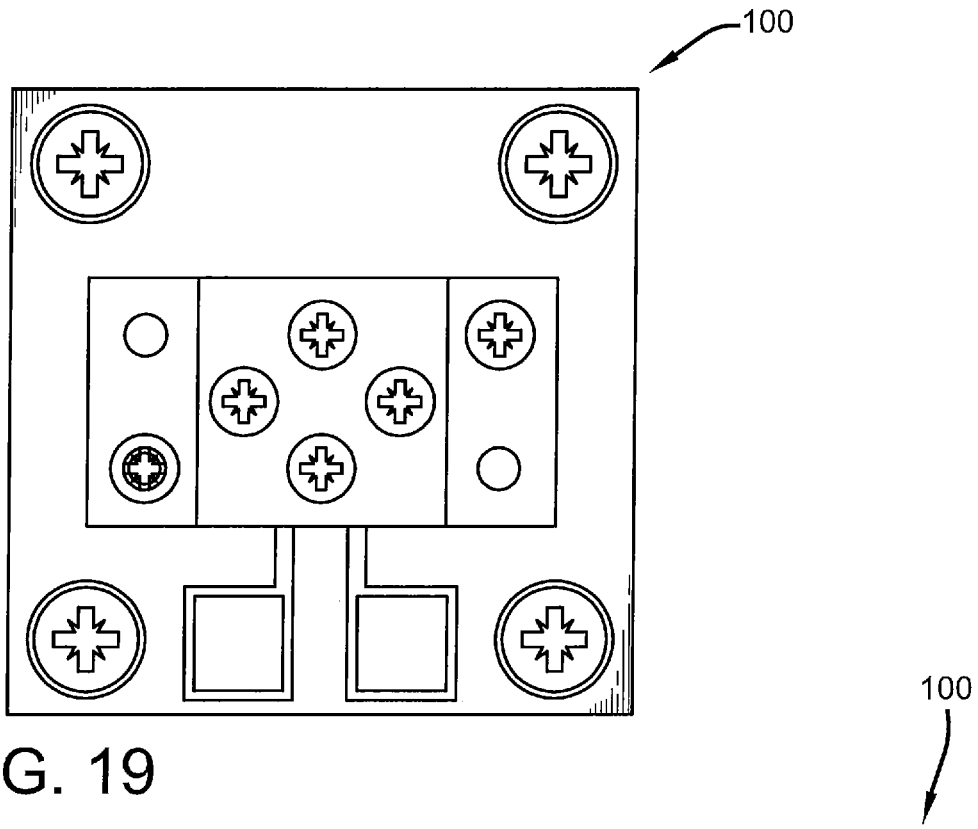
FIG. 19 illustrates a rear view of the power sensing assembly in accordance with the disclosed architecture.
Figure 20:
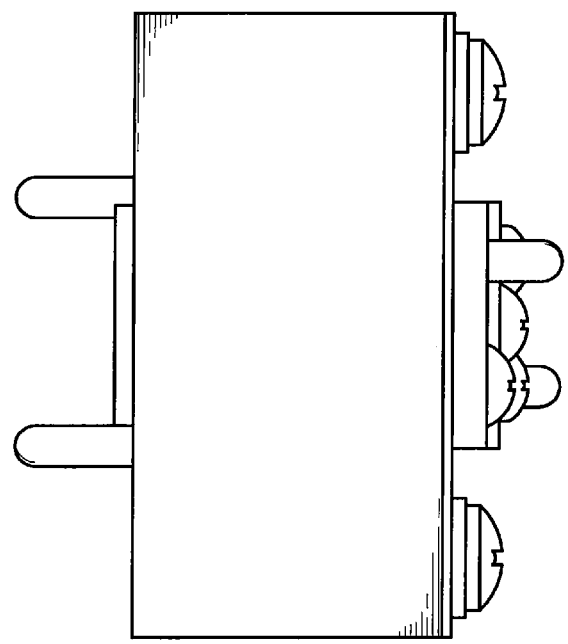
FIG. 20 illustrates a side view of the power sensing assembly in accordance with the disclosed architecture.

As illustrated in FIGS. 17 and 18, the backside short shim 150 comprises a channel cutout 152. The channel cutout 152 is positioned adjacent to the opening 144 of the mounting plate. This allows the pair of bond wires 140 to project out and align with a projected PCB trace and then turn downward to align with the channel cutout 152. The pair of bond wires 140 typically will remain within the approximately 0.020 inch depth profile, but could be made deeper as permitted by the overall thickness of the backside short shim 150 to remain inside the channel cutout 152 in the backside short shim 150 as illustrated in FIGS. 13 and 14.

The backside short shim 150 may be varied in thickness which will vary a distance from a plane of a resistive termination at the dual ridged waveguide output 114 to the backside short 154. This variation in thickness will alter the constructive/destructive interference effect between a forward wave and any existing residual reflected waves returning back from a back short ground plane. This allows an overall input reflection response to be tuned as a function of frequency if desired. This also provides a capacity to specifically optimize other frequency bands within the 50 to 75 GHz bandwidth if desired. As with the mounting plate 142, the backside short shim 150 and the backside short may be aligned with the housing 102 via the alignment pins 156 and is secured via the fasteners 158.

In an additional embodiment, a method for measuring power comprises providing a power sensing assembly 100 comprising a dual ridged waveguide impedance transformer 120, a terminating element 136, and a sensing element 138. The terminating element 136 and the sensing element 138 are aligned substantially perpendicularly to each other and are positioned with respect to the dual ridged waveguide impedance transformer 120 to achieve good match characteristics for a high frequency wave. Next, the terminating element 136 is electrically isolated from the sensing element 138 while remaining thermally coupled by placing a substrate 134 between them. Tuning capability is also provided if necessary to achieve an optimal matched termination for specific frequency ranges within the waveguide bandwidth that is independent of the sensing element 138.

The method allows for attachment of the resistive component 130 to a housing 102 of the power sensing assembly 100 that allows for good match characteristics while simultaneously providing good thermal isolation to the waveguide structure to maximize efficiency. This is achieved by the alignment of the terminating element 136 and the sensing element 138 with respect to the dual ridged waveguide impedance transformer 120. As the tuning capability is affected by a distance between a backside short 154 and a plane of resistive termination, a backside short shim 150 of an appropriate thickness is selected and positioned between the housing 102 and the backside short 154. The thickness of the backside short shim 150 is selected based on a desired interference effect between a forward wave and a residual wave returning from the backside short 154. Additionally, a desired DC bias circuitry used to measure the change in resistance of the sensing element 138 may be further isolated by providing an inductive reactance to high frequency signals.

The power sensing assembly 100 uses the inherent broadband nature of the dual ridged waveguide topology and dual ridged waveguide impedance transformer to provide a wideband terminating match, via the terminating element 136, to minimize mismatch power sensing error while simultaneously indirectly measuring broadband power via the sensing element 138. The power sensing assembly 100 is scalable in configuration and is applicable to all geometric sizes and shapes of rigid waveguide assemblies. The power sensing assembly 100 provides an interface to mate with all corresponding standard waveguide configurations. The functionality is derived from the alignment of the sensing element 138 and the terminating element 136 to the dual ridged waveguide impedance transformer 120. These elements may be modified to accommodate different frequency ranges, primarily by changing the waveguide configuration, or by altering resistor and sensor placement, value, or type. For example, in an additional embodiment, if the desired frequency bandwidth is narrow enough, the impedance transformer may be bypassed in its entirety and the resistive component 130 may be simply attached to the output of a standard waveguide configuration at midpoint location 118. The value of the matched termination is then changed accordingly to match that of the standard waveguide impedance for the intended frequency response.

Other variations are within the spirit of the present invention. Thus, while the invention is susceptible to various modifications and alternative constructions, a certain illustrated embodiment thereof is shown in the drawings and has been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Preferred embodiments of this invention are described herein. Variations of those preferred embodiments may become apparent to those of ordinary skill in the art upon reading the foregoing description. The inventor expects skilled artisans to employ such variations as appropriate, and the inventor intends for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A power sensing assembly comprising:
a housing comprising a standard waveguide interface and a dual ridged waveguide impedance transformer; and a resistive component aligned with the dual ridged waveguide transformer, the resistive component comprising a terminating element and a sensing element substantially perpendicularly oriented to the terminating element.

2. The power sensing assembly of claim 1, wherein the standard waveguide interface and the dual ridged waveguide transformer is quadrilateral, rectangular or circular in configuration.

3. The power sensing assembly of claim 1, wherein the dual ridged waveguide transformer comprises a plurality of steps that transform an impedance from the standard waveguide interface to that of the resistive component while simultaneously concentrating a field energy along the dual ridged waveguide transformer.

4. The power sensing assembly of claim 1, wherein the terminating element is thermally coupled to the sensing element.

5. The power sensing assembly of claim 1, wherein resistive component further comprises a substrate.

6. The power sensing assembly of claim 5, wherein the terminating element is separated from the sensing element by the substrate.

7. The power sensing assembly of claim 1, further comprising a backside short shim attachable to the housing for tuning a matched termination of the terminating element independently from the sensing element.

8. The power sensing system of claim 1, wherein the sensing element is a resistive structure operable at a constant resistance in an energy detecting mode.

9. A power sensing assembly comprising:
a housing; and
a resistive component attachable to the housing, the resistive component comprising a terminating element and a sensing element electrically isolated from and perpendicularly oriented to the terminating element.

10. The power sensing assembly of claim 9, wherein the terminating element is a matched termination resistor.

11. The power sensing assembly of claim 9, wherein the sensing element operates at a constant resistance in an energy detecting mode.

12. The power sensing assembly of claim 9, wherein the terminating element is a source of thermal energy for the sensing element.

13. The power sensing assembly of claim 9, wherein the housing comprises a dual ridged waveguide transformer for concentrating power perpendicularly to an axis of a high frequency wave propagation within the dual ridged waveguide transformer.

14. The power sensing assembly of claim 13, wherein the concentrated power is transferred to the sensing element.

15. The power sensing assembly of claim 13, wherein the dual ridged waveguide transformer provides a wideband terminating match to decrease power sensor error while simultaneously indirectly measuring power.

* * * * *